United States Patent
Sheelavant et al.

(10) Patent No.: US 9,799,548 B2
(45) Date of Patent: Oct. 24, 2017

(54) SUSCEPTORS FOR ENHANCED PROCESS UNIFORMITY AND REDUCED SUBSTRATE SLIPPAGE

(71) Applicant: APPLIED MATERIALS, INC., Santa Clara, CA (US)

(72) Inventors: Gangadhar Sheelavant, Bagalkot (IN); Mahadev Joshi, Bangalore (IN); Yuji Aoki, Yokohama (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 642 days.

(21) Appl. No.: 14/197,699

(22) Filed: Mar. 5, 2014

(65) Prior Publication Data
US 2014/0265091 A1    Sep. 18, 2014

Related U.S. Application Data

(60) Provisional application No. 61/788,920, filed on Mar. 15, 2013.

(51) Int. Cl.
*H01L 21/687*    (2006.01)
*C30B 25/12*    (2006.01)
(Continued)

(52) U.S. Cl.
CPC ........ *H01L 21/68735* (2013.01); *C30B 25/12* (2013.01); *H01L 21/68742* (2013.01); *C23C 16/4585* (2013.01); *H01L 21/67115* (2013.01)

(58) Field of Classification Search
CPC ......... H01L 21/68735; H01L 21/68742; H01L 21/68785; H01L 21/6875; H01L 2221/683;
(Continued)

(56) References Cited

U.S. PATENT DOCUMENTS 6,231,038 B1 * 5/2001 Keyser ............. H01L 21/68721
                                                    269/100
6,395,363 B1 * 5/2002 Ballance ........... H01L 21/68735
                                                    118/500
(Continued)

FOREIGN PATENT DOCUMENTS

CN    101772836 A  *  7/2010
EP       1132950 A1     9/2001
(Continued)

OTHER PUBLICATIONS

International Search Report and Written Opinion mailed Jun. 2, 2014 for PCT Application No. PCT/US2014/021639.
(Continued)

*Primary Examiner* — Larry E Waggle, Jr.
*Assistant Examiner* — Mahdi H Nejad
(74) *Attorney, Agent, or Firm* — Moser Taboada; Alan Taboada

(57) ABSTRACT

Apparatus for supporting a substrate are provided herein. In some embodiments, a substrate support includes a susceptor plate having a top surface; a recess formed within the top surface, wherein the recess is defined by an edge; and a plurality of angled support elements disposed within the recess and along the edge of the recess, wherein each angled support element comprises a first surface downwardly sloped toward a center of the recess.

20 Claims, 5 Drawing Sheets

(51) Int. Cl.
 *H01L 21/67* (2006.01)
 *C23C 16/458* (2006.01)
(58) Field of Classification Search
 CPC ......... H01L 21/67115; H01L 21/67248; C23C 16/4585; C23C 14/50; C30B 25/12
 USPC ......... 118/728; 269/14, 289 R; 392/416, 418
 See application file for complete search history.

(56) References Cited

U.S. PATENT DOCUMENTS

| | | | |
|---|---|---|---|
| 6,695,921 B2 | 2/2004 | Cheng et al. | |
| 7,247,818 B2* | 7/2007 | Kondou | H05B 3/143 118/725 |
| 8,347,811 B2* | 1/2013 | Bucci | B05B 13/02 118/500 |
| 8,409,355 B2* | 4/2013 | Rasheed | C23C 16/4581 118/725 |
| 9,017,483 B2* | 4/2015 | Fujikawa | C23C 16/4588 118/728 |
| 2002/0162630 A1* | 11/2002 | Satoh | C23C 16/4583 156/345.51 |
| 2003/0178145 A1* | 9/2003 | Anderson | C23C 16/4586 156/345.51 |
| 2003/0183611 A1* | 10/2003 | Gregor | C30B 25/12 219/390 |
| 2004/0055707 A1* | 3/2004 | Sato | B08B 17/00 156/345.11 |
| 2005/0217585 A1* | 10/2005 | Blomiley | C23C 16/4586 118/728 |
| 2006/0180076 A1* | 8/2006 | Kanaya | C30B 25/12 117/89 |
| 2006/0180086 A1* | 8/2006 | Kanaya | C23C 16/4584 118/728 |
| 2006/0180087 A1 | 8/2006 | Blomiley et al. | |
| 2007/0026148 A1* | 2/2007 | Arai | C23C 16/4584 427/248.1 |
| 2007/0089836 A1* | 4/2007 | Metzner | H01L 21/67103 156/345.51 |
| 2008/0314319 A1* | 12/2008 | Hamano | C23C 16/4583 118/728 |
| 2009/0127672 A1* | 5/2009 | Kinbara | C23C 16/4588 257/652 |
| 2009/0165721 A1* | 7/2009 | Pitney | C23C 16/4583 118/728 |
| 2009/0266299 A1* | 10/2009 | Rasheed | C23C 16/4581 118/723 R |
| 2011/0073037 A1* | 3/2011 | Ohnishi | C23C 16/4583 118/641 |
| 2011/0209660 A1* | 9/2011 | Myo | C23C 16/4586 117/88 |
| 2012/0146191 A1* | 6/2012 | Yasuhara | C23C 16/303 257/615 |
| 2016/0064268 A1* | 3/2016 | Lin | C30B 25/12 118/725 |
| 2016/0133504 A1* | 5/2016 | Chu | H01L 21/68735 165/146 |
| 2016/0340799 A1* | 11/2016 | Pitney | C30B 25/12 |

FOREIGN PATENT DOCUMENTS

| | | | |
|---|---|---|---|
| JP | H09-52792 A | | 2/1997 |
| JP | H0952792 A | * | 2/1997 |
| JP | 2002231713 A | * | 8/2002 |
| JP | 2003 289045 A | | 10/2003 |
| JP | 2003289045 A | * | 10/2003 |
| JP | 2008124127 A | * | 8/2008 |
| JP | 2009016567 A | * | 1/2009 |
| WO | EP 1132950 A1 | * | 9/2001 |
| WO | WO 2008-157605 A1 | | 12/2008 |
| WO | WO2008157605 A1 | * | 12/2008 |

OTHER PUBLICATIONS

U.S. Appl. No. 13/028,842, filed Feb. 16, 2011, Myo et al.
Search Report from the State Intellectual Property Office of the People's Republic of China for Chinese Application No. 2014800038134.

* cited by examiner

SUSCEPTORS FOR ENHANCED PROCESS UNIFORMITY AND REDUCED SUBSTRATE SLIPPAGE

CROSS-REFERENCE TO RELATED APPLICATIONS

This application claims benefit of U.S. provisional patent application Ser. No. 61/788,920, filed Mar. 15, 2013, which is herein incorporated by reference in its entirety.

FIELD

Embodiments of the present invention generally relate to semiconductor processing.

BACKGROUND

Susceptors are used to hold a substrate in the processing area of substrate processing chambers, such as epitaxial deposition chambers. The inventors have observed that conventionally used susceptor designs can lead to process non-uniformity as well as substrate slipping issues when the substrate is placed on the susceptor.

Therefore, the inventors have provided embodiments of improved susceptors for supporting substrates.

SUMMARY

Apparatus for supporting a substrate are provided herein. In some embodiments, a substrate support includes a susceptor plate having a top surface; a recess formed within the top surface, wherein the recess is defined by an edge; and a plurality of angled support elements disposed within the recess and along the edge of the recess, wherein each angled support element comprises a first surface downwardly sloped toward a center of the recess.

In some embodiments, a substrate support includes a susceptor plate having a top surface; a recess formed within the top surface, wherein the recess is defined by an edge; a plurality of angled support elements disposed within the recess and along the edge of the recess, wherein each angled support element comprises a first surface downwardly sloped toward a center of the recess, wherein the slope of the first surface is about 0.5 degrees to about 18 degrees from horizontal; and a plurality of lift pin holes in the recess to allow a lift pin module to pass through each of the plurality of lift pin holes to raise or lower the substrate.

In some embodiments, an apparatus for processing a substrate includes a process chamber; a substrate support; a support bracket supporting the substrate support within the process chamber; and a substrate lift assembly disposed below the substrate support comprising a substrate lift shaft and a plurality of lift pin modules to raise and lower a substrate atop the substrate support. The substrate support includes a susceptor plate having a top surface; a recess formed within the top surface, wherein the recess is defined by an edge; and a plurality of angled support elements disposed within the recess and along the edge of the recess, wherein each angled support element comprises a first surface downwardly sloped toward a center of the recess.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
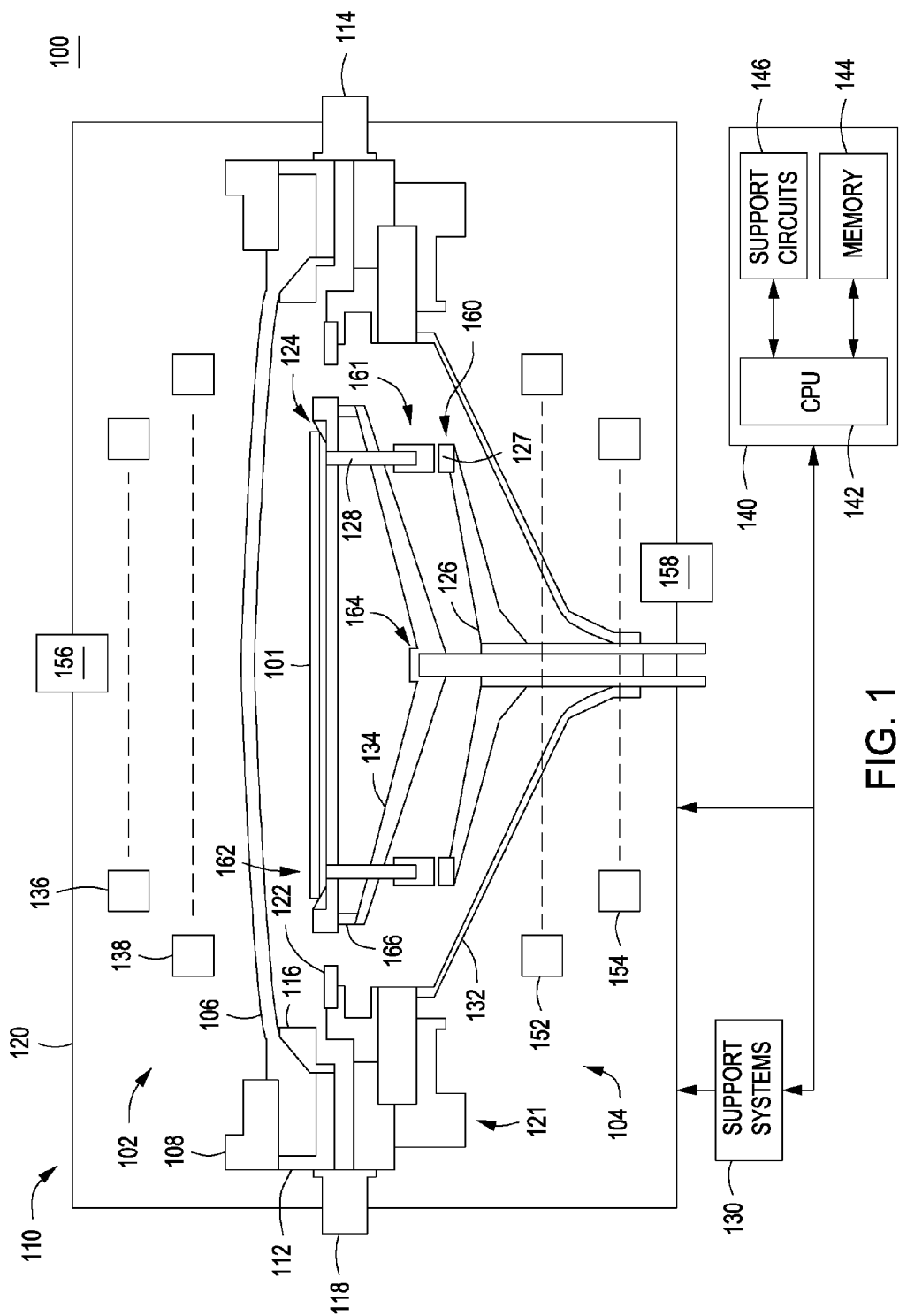
FIG. 1 depicts a schematic side view of a process chamber suitable for use with an apparatus for supporting a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for supporting a substrate are provided herein. In some embodiments, the inventive apparatus may advantageously provide one or more substrate supporting elements that prevent a substrate from slipping when placed upon the substrate support. In some embodiments, the inventive apparatus may further advantageously reduce the contact area between the substrate supporting elements and the substrate thereby reducing process non-uniformities that may arise due to thermal gradients in the substrate.

FIG. 1 depicts a schematic side view of a process chamber 100 suitable for use with an apparatus for supporting a substrate in accordance with some embodiments of the present invention. In some embodiments, the process chamber 100 may be a commercially available process chamber, such as the RP EPI® reactor, available from Applied Materials, Inc. of Santa Clara, Calif., or any suitable semiconductor process chamber suitable for performing epitaxial deposition processes. Other process chambers may also be used, however.

The process chamber 100 may generally comprise a chamber body 110, support systems 130, and a controller 140. The chamber body 110 generally includes an upper portion 102, a lower portion 104, and an enclosure 120. The upper portion 102 is disposed on the lower portion 104 and includes a lid 106, a clamp ring 108, a liner 116, a baseplate 112, one or more upper heating lamps 136 and one or more lower heating lamps 152, and an upper pyrometer 156. In some embodiments, the lid 106 has a dome-like form factor, however, lids having other form factors (e.g., flat or reverse curve lids) are also contemplated. The lower portion 104 is coupled to a process gas intake port 114 and an exhaust port 118 and comprises a baseplate assembly 121, a lower dome 132, a substrate support 124, a pre-heat ring 122, a substrate lift assembly 160, a substrate support assembly 164, one or more upper heating lamps 138 and one or more lower heating lamps 154, and a lower pyrometer 158. Although the term "ring" is used to describe certain components of the process chamber 100, such as the pre-heat ring 122, it is contemplated that the shape of these components need not be circular and may include any shape, including but not limited to, rectangles, polygons, ovals, and the like.

During processing, the substrate 101 is disposed on the substrate support 124. The heating lamps 136, 138, 152, and 154 are sources of infrared (IR) radiation (e.g., heat) and, in operation, generate a pre-determined temperature distribution across the substrate 101. The lid 106, the clamp ring 108, and the lower dome 132 are formed from quartz; however, other IR-transparent and process compatible materials may also be used to form these components.

The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In some embodiments, a lift pin module 161 comprises an optional upper portion of the lift pin 128 that is movably disposed through a lift pin hole 162 in the substrate support 124. In operation, the substrate lift shaft 126 is moved to engage the lift pins 128. When engaged, the lift pins 128 may raise the substrate 101 above the substrate support 124, for example into a position to facilitate introducing or removing the substrate into or from the process chamber, or lower the substrate 101 onto the substrate support 124, for example, for processing.

FIGS. 2, 5, 7, and 9 depict embodiments of a substrate support 124 in accordance with some embodiments of the present invention. The substrate support 124 comprises a susceptor plate 202 having a top surface 204. The susceptor plate 202 can be made of suitable susceptor plate materials, for example, a carbon graphite base with silicon carbide coating. In some embodiments, a recess 206 is formed in the top surface 204. In some embodiments, the recess 206 is defined by an edge 208.

In some embodiments, three or more angled support elements 214 are disposed within the recess 206. In some embodiments, the angled support elements 214 are disposed along the edge 208 of the recess 206. Each angled support element 214 has a first surface 220 that is downwardly sloped toward a center 210 of the recess 206. In some embodiments, the slope of the first surface 220 is about 0.5 degrees to about 18 degrees from horizontal. While a conventional substrate support comprises a ledge contacting and supporting the surface along its entire edge, the inventors have observed that reducing the contact point between the support surface and the substrate reduces non-uniformity due to thermal gradients caused by heat transfer between the edge of the substrate and susceptor. Thus, the inventors have provided a substrate support 124 having three or more angled support elements 214 to support the substrate.

Figure 2:
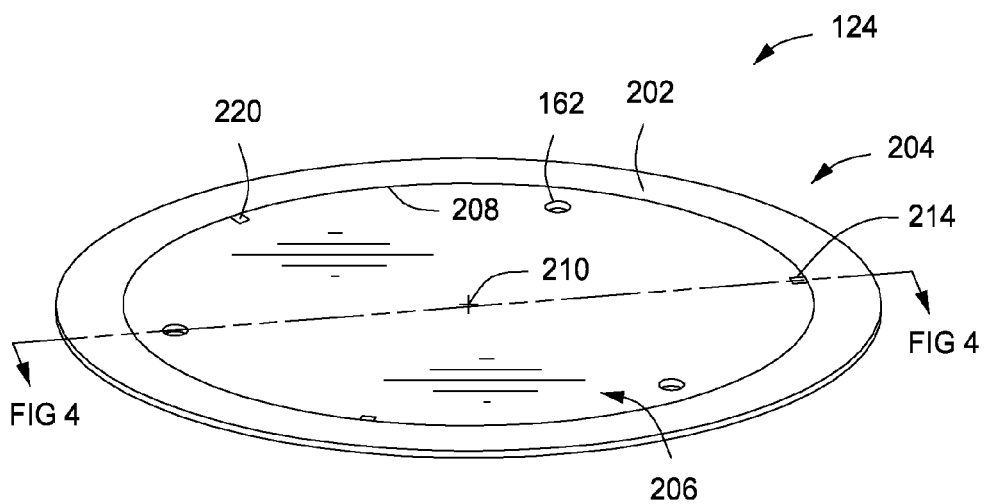
FIG. 2 depicts an apparatus for supporting a substrate in accordance with some embodiments of the present invention.
Figure 4:
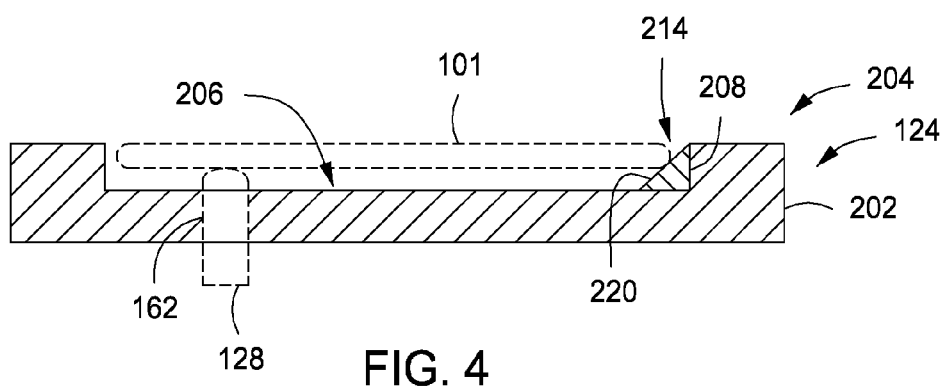
FIG. 4 depicts a cross-sectional view of the apparatus for supporting a substrate shown in FIG. 2 in accordance with some embodiments of the present invention.
Figure 5:
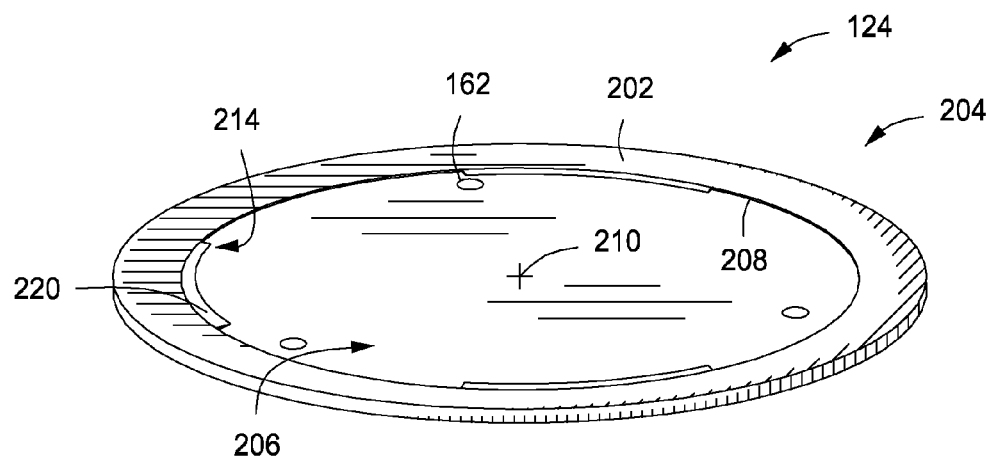
FIG. 5 depicts an apparatus for supporting a substrate in accordance with some embodiments of the present invention.
Figure 9:
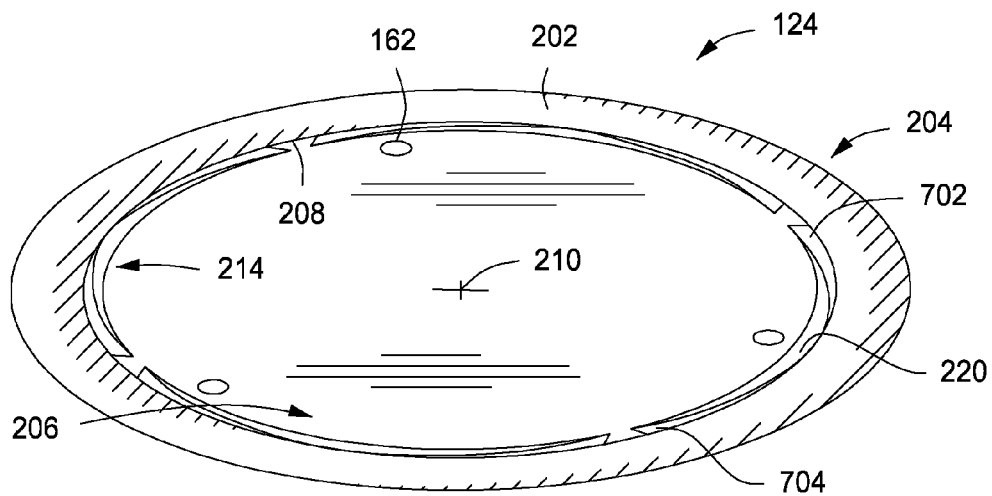
FIG. 9 depicts an apparatus for supporting a substrate in accordance with some embodiments of the present invention.
Figure 10:
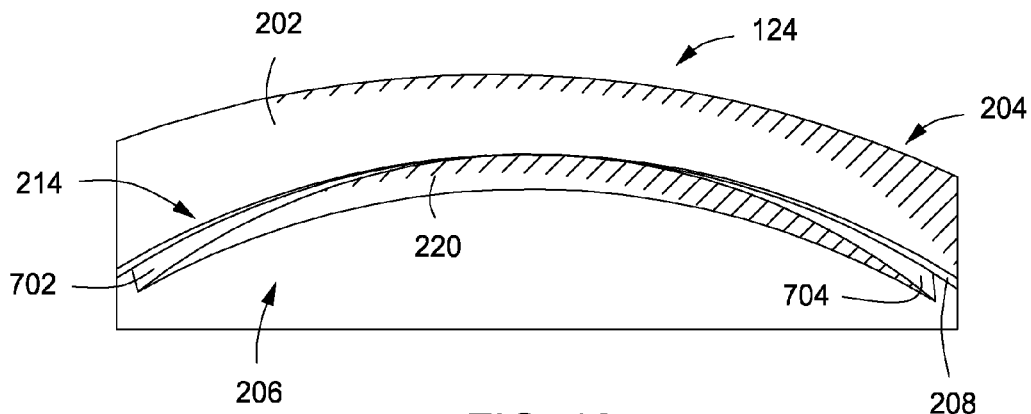
FIG. 10 depicts an angled supporting element depicted in FIG. 9 in accordance with some embodiments of the present invention.

FIG. 2 and FIG. 5 depict a susceptor plate 202 having three (3) angled support elements 214. In some embodiments, as depicted in FIGS. 7 and 9, the susceptor plate 202 may have more than three angled support elements 214, such as 4, 6, 12 or more angled support elements. For example, FIG. 7 depicts a susceptor plate having 12 angled support elements 214 and FIG. 9 depicts a susceptor plate having 4 angled support elements 214. In some embodiments, for example as depicted in FIGS. 2-10, the angled support element 214 may vary in length depending upon the angle of the angled support element 214. The angled support element 214 may also vary in width. For example, the number and width of the angled support elements 214 may be selected to control the total number of contact points and locations about the periphery of the substrate as well as the total contact surface area between the substrate and the angled support elements 214.

FIG. 4 depicts a cross-sectional view of the susceptor plate 202 shown in FIG. 2 in accordance with some embodiments of the present invention. The angled support element 214 is disposed in the recess 206 and along the edge 208 of the recess 206. The angled support element 214 comprises a first surface 220 downwardly sloped toward a center 210 of the recess 206. A lift pin 128, movably disposed through a lift pin hole 162 in the recess 206, may raise the substrate 101 above the susceptor plate 202 or lower the substrate 101 onto the first surface 220 such that a backside of the substrate 101, when present, is disposed over and spaced apart from the recess 206 of the susceptor plate 202. In some embodiments, the angled support element 214 is integrally formed within the recess 206. In some embodiments, the angled support element 214 is a separate component that is coupled to the recess 206.

In some embodiments, as depicted in FIG. 2, none of the angled support elements 214 are aligned with a lift pin hole 162. In some embodiments, at least one, or in some embodiments all, of the angled support elements 214 are aligned with corresponding lift pin holes along a common radius. In some embodiments, three lift pin holes are provided. In some embodiments, three lift pin holes are provided with three angled support elements 214 each aligned with a corresponding one of the three lift pin holes. In the embodiment depicted in FIG. 7, each of the lift pin holes are aligned with one of the angled support elements 214 along a common radius. In some embodiments, aligning at least one of the angled support elements 214 with a lift pin hole 162 can reduce slippage of the substrate when placed atop the angled support elements 214. In some embodiments, at least one of the angled support elements 214 is spaced equidistance from an adjacent angled support element 214. In some embodiments, at least one of the angled support elements 214 is spaced an unequal distance from an adjacent angled support element 214.

Figure 3:
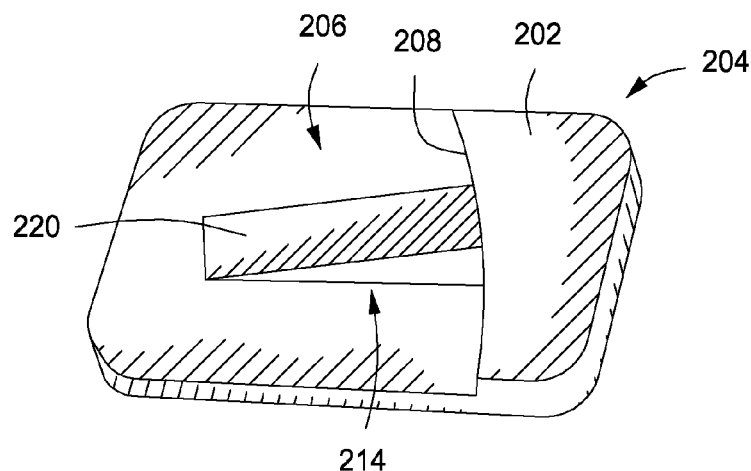
FIG. 3 depicts an angled supporting element depicted in FIG. 2 in accordance with some embodiments of the present invention.
Figure 6:
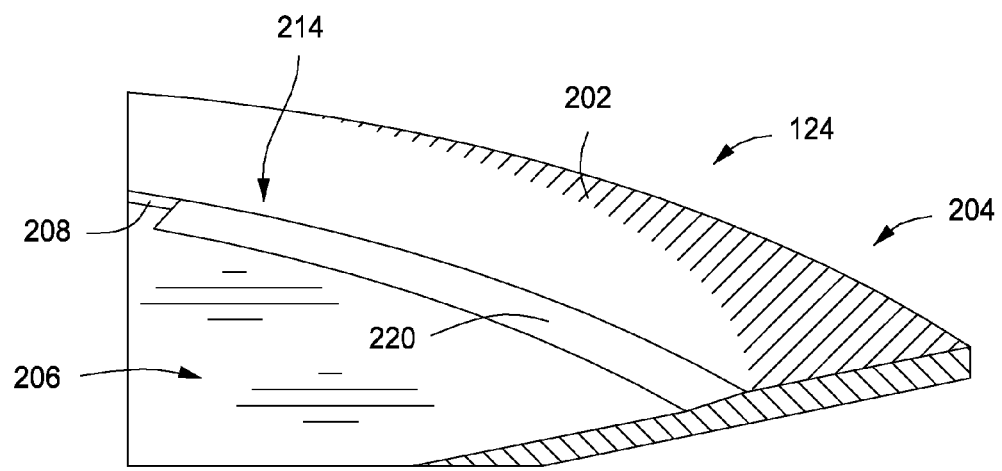
FIG. 6 depicts an angled supporting element depicted in FIG. 5 in accordance with some embodiments of the present invention.
Figure 7:
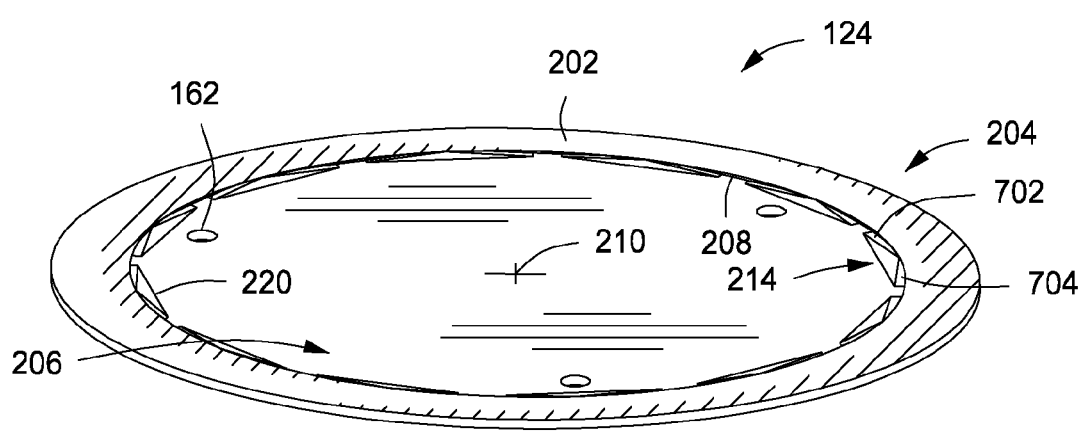
FIG. 7 depicts an apparatus for supporting a substrate in accordance with some embodiments of the present invention.
Figure 8:
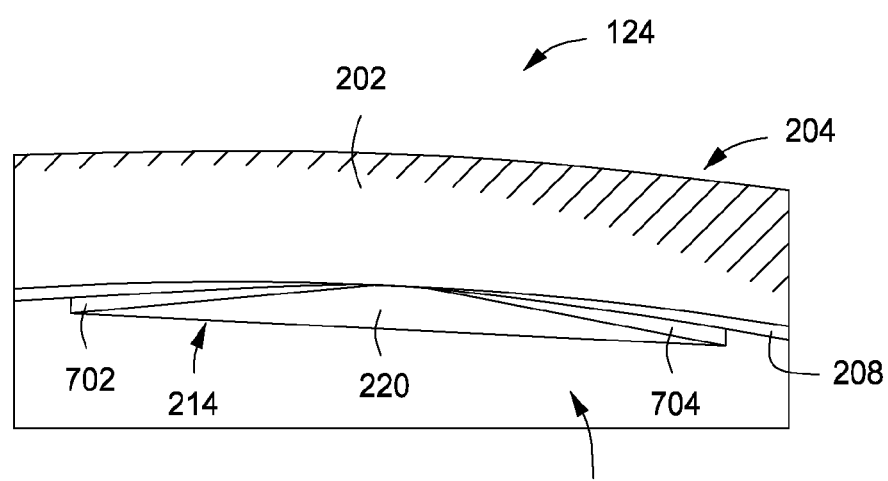
FIG. 8 depicts an angled supporting element depicted in FIG. 7 in accordance with some embodiments of the present invention.

FIGS. 3 and 6 depict one embodiment of an angled support element 214 having a first surface 220 that is downwardly sloped toward the center of the recess 206. FIGS. 7-10 depict an embodiment of an angled support element 214 having a first surface 220 that is downwardly sloped toward the center of the recess 206, a second surface 702 coupled to the first surface 220 and sloped substantially perpendicular to the first surface 220, and a third surface 704 coupled to the first surface 220 and sloped substantially perpendicular to the first surface 220 in a direction opposing the second surface 702 (e.g., a truncated pyramidal shape).

Figure 11:
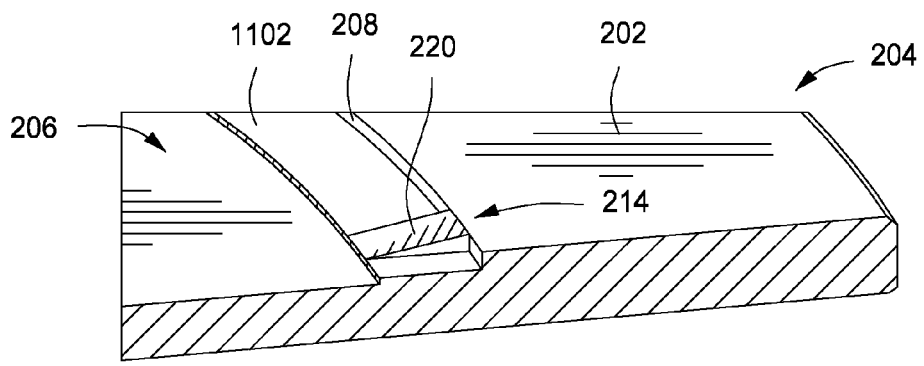
FIG. 11 depicts a step supporting an angled supporting element in accordance with some embodiments of the present invention.

In some embodiments, as depicted in FIG. 11, the susceptor plate 202 has a step 1102 formed within the recess 206 along the edge 208 of the recess 206. In some embodiments, the plurality of angled support elements 214 may be disposed entirely atop the step 1102 in any of the configurations described above. Placing the angled support element 214 atop the step advantageously reduces slippage of the substrate when placed atop the substrate support 124, for example, by reducing the angle of the angled support element 214, while maintaining the separation of the substrate and the susceptor plate 202 provided by the recess 206.

Returning to FIG. 1, the support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The CPU 142 may be any form of a general purpose computer processor that can be used in an industrial setting. The support circuits 146 are coupled to the CPU 142 and may comprise cache, clock circuits, input/output subsystems, power supplies, and the like. Software routines may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some embodiments, for example where the process chamber 100 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

While the foregoing is directed to embodiments of the present invention, other and further embodiments of the invention may be devised without departing from the basic scope thereof.

The invention claimed is:

1. A substrate support, comprising:
a susceptor plate having a top surface;
a central recess formed within the top surface, wherein the recess is defined by a continuous edge circumscribing the recess; and
a plurality of angled support elements disposed within the recess and along the continuous edge of the recess, wherein each angled support element comprises a first surface downwardly sloped toward a center of the recess and extending from the continuous edge of the recess to a vertex of the angled support element subtended by the recess, wherein the first surface is configured to support an edge of a substrate when disposed on the substrate support.

2. The substrate support of claim 1, wherein the slope of the first surface is about 0.5 degrees to about 18 degrees from horizontal.

3. The substrate support of claim 1, wherein the susceptor plate comprises a carbon graphite base with a silicon carbide coating.

4. The substrate support of claim 1, further comprising a plurality of lift pin holes in the recess to allow a lift pin module to pass through each of the plurality of lift pin holes to raise or lower a substrate when disposed on the substrate support.

5. The substrate support of claim 4, wherein at least one of the angled support elements is aligned with a lift pin hole along a common radius.

6. The substrate support of claim 1, wherein the recess comprises 3 to 12 angled support elements.

7. The substrate support of claim 1, wherein each angled support element is spaced equidistantly from an adjacent angled support element.

8. The substrate support of claim 1, wherein the plurality of angled support elements are integrally formed within the recess.

9. The substrate support of claim 1, wherein the plurality of angled support elements are removably coupled to the recess.

10. The substrate support of claim 1, the top surface further comprising a step formed atop the recess, wherein the plurality of angled support elements are disposed atop the step.

11. The substrate support of claim 1, wherein the plurality of angled support elements further comprise:
a second surface coupled to the first surface and sloped substantially perpendicular to the first surface; and
a third surface coupled to the first surface and sloped substantially perpendicular to the first surface in a direction opposing the second surface.

12. A substrate support, comprising:
a susceptor plate having a top surface;
a central recess formed within the top surface, wherein the recess is defined by a continuous edge that circumscribes the recess;
a plurality of angled support elements disposed within the recess and along the continuous edge of the recess, wherein each angled support element comprises a first surface downwardly sloped toward a center of the recess and extending from the continuous edge of the recess to a vertex of the angled support element subtended by the recess, wherein the slope of the first surface is about 0.5 degrees to about 18 degrees from horizontal, and wherein the first surface is configured to support an edge of a substrate when disposed on the substrate support; and
a plurality of lift pin holes in the recess to allow a lift pin module to pass through each of the plurality of lift pin holes to raise or lower a substrate when disposed on the substrate support.

13. An apparatus for processing a substrate, comprising:
a process chamber;

a substrate support, comprising:
- a susceptor plate having a top surface;
- a central recess formed within the top surface, wherein the recess is defined by a continuous edge that circumscribes the recess; and
- a plurality of angled support elements disposed within the recess and along the continuous edge of the recess, wherein each angled support element comprises a first surface downwardly sloped toward a center of the recess and extending from the continuous edge of the recess to a vertex of the angled support element subtended by the recess, and wherein the first surface is configured to support an edge of a substrate when disposed on the substrate support;
- a support bracket supporting the substrate support within the process chamber; and
- a substrate lift assembly disposed below the substrate support comprising a substrate lift shaft and a plurality of lift pin modules to raise and lower a substrate atop the substrate support.

14. The substrate support of claim 13, wherein the slope of the first surface is about 0.5 degrees to about 18 degrees from horizontal.

15. The substrate support of claim 13, further comprising a plurality of lift pin holes in the recess to allow a lift pin module to pass through each of the plurality of lift pin holes to raise or lower the substrate.

16. The substrate support of claim 15, wherein at least one of the angled support elements is aligned with a lift pin hole along a common radius.

17. The substrate support of claim 13, wherein the recess comprises 3 to 12 angled support elements.

18. The substrate support of claim 13, wherein each angled support element is spaced equidistantly from an adjacent angled support element.

19. The substrate support of claim 13, wherein the plurality of angled support elements further comprise:
- a second surface coupled to the first surface and sloped substantially perpendicular to the first surface; and
- a third surface coupled to the first surface and sloped substantially perpendicular to the first surface in a direction opposing the second surface.

20. The substrate support of claim 13, wherein the top surface further comprises a step formed atop the recess, wherein the plurality of angled support elements are disposed atop the step.

* * * * *